(12) United States Patent
Sood

(10) Patent No.: US 7,256,579 B2
(45) Date of Patent: Aug. 14, 2007

(54) METHOD FOR IMAGING BIOLOGICAL MATTER USING AN ADIABATIC PULSE

(75) Inventor: Rohit Sood, Albuquerque, NM (US)

(73) Assignee: The Board of Trustees of the Leland Stanford Junior University, Palo Alto, CA (US)

( * ) Notice: Subject to any disclaimer, the term of this patent is extended or adjusted under 35 U.S.C. 154(b) by 0 days.

(21) Appl. No.: 10/997,209

(22) Filed: Nov. 23, 2004

(65) Prior Publication Data

US 2005/0110485 A1 May 26, 2005

Related U.S. Application Data

(60) Provisional application No. 60/524,923, filed on Nov. 24, 2003.

(51) Int. Cl.
*G01V 3/00* (2006.01)
(52) U.S. Cl. ....................... 324/307; 324/309
(58) Field of Classification Search .............. 324/307, 324/309, 312, 314
See application file for complete search history.

(56) References Cited

U.S. PATENT DOCUMENTS

| | | | |
|---|---|---|---|
| 5,588,431 A | | 12/1996 | Mani et al. |
| 6,265,875 B1 | * | 7/2001 | Saranathan et al. ......... 324/314 |
| 6,294,914 B1 | * | 9/2001 | Fiat ............................ 324/312 |
| 6,313,631 B1 | | 11/2001 | Fiat et al. |
| 6,486,668 B1 | * | 11/2002 | Ma .............................. 324/307 |

OTHER PUBLICATIONS

Arai, Toshiyuki et al., "*Measurement of Local Cerebral Blood Flow by Magnetic Resonance Imaging: In Vivo Autoradiographic Strategy Using $^{17}$O-Labeled Water*", Elsevier Science Inc., Brain Research Bulletin, vol. 45, (1998) pp. 451-456.

Charagundla, Sridhar R., et al., "*Off-Resonance Proton $T_{1\rho}$ Dispersion Imaging of $^{17}$O-enriched Tissue Phantoms*", Magnetic Resonance in Medicine, vol. 39, (1998) pp. 588-595.

de Crespigny, A.J. et al., "*MRI of Focal Cerebral Ischemia Using $^{17}$O-Labeled Water*", Magnetic Resonance in Medicine, vol. 43, (2000) pp. 876-883.

Fiat, D., et al., "*In Vivo $^{17}$O NMR Study of Rat Brain During $^{17}$O$_2$ Inhalation*", Magnetic Resonance in Medicine, vol. 24, (1992) pp. 370-374.

Hopkins, Amos L. et al., "*Oxygen-17 contrast Agents Fast Imaging Techniques*", Investigative Radiology, vol. 23, Suppl. 1, (1988) pp. S240-S242.

(Continued)

*Primary Examiner*—Louis M. Arana
(74) *Attorney, Agent, or Firm*—Dorsey & Whitney LLP

(57) ABSTRACT

The present invention includes a method for MR imaging of a biological matter having $H_2O^{17}$ content by performing $T1_\rho^{off}$ imaging of said $H_2O^{17}$ content in said biological matter. The $T1_\rho^{off}$ imaging is performed by applying an RF pulse with a resonance frequency offset to said biological matter to create off resonance spin locking conditions in said biological matter. Thus, parts of the biological matter having different $H_2O^{17}$ concentrations are differentiated because of their different T2/T1 ratios.

20 Claims, 11 Drawing Sheets

OTHER PUBLICATIONS

Moran, Paul R. et al., "*Near-Resonance Spin-Lock Contrast*", Elsevier Science Inc., Magnetic Resonance Imaging, vol. 13, No. 6, (1995) pp. 837-846.

Pekar, J., et al., "*In Vivo Measurement of Cerebral Oxygen Consumption and Blood Flow Using $^{17}O$ Magnetic Resonance Imaging*", Academic Press, Inc., Magnetic Resonance in Medicine, vol. 21, (1991) pp. 313-319.

Pike, G. Bruce et al., "*In Pulsed Magnetization Transfer Spin-Echo MR Imaging*", Journal of Magnetic Resonance Imaging, vol. 3, No. 3 (1993) pp. 1-6.

Reddy, Ravinder et al., "*$^{17}O$-Decoupled $^{1}H$ Detection Using a Double-Tuned Coil*", Elsevier Science Inc., Magnetic Resonance Imaging, vol. 14, No. 9 (1996) pp. 1073-1078.

Rizi, Rahim R. et al., "*Proton $T_{1p}$-Dispersion Imaging of Rodent Brain at 1.9T*", Journal Metabolic Magnetic Resonance and Computing Center, vol. 8, No. 5, (1998) pp. 1090-1096.

Wolff, Steven D., et al., "*Magnetization Transfer Contrast (MTC) and Tissue Water Proton Relaxation in Vivo*", Magnetic Resonance in Medicine, vol. 10, (1989) pp. 135-144.

\* cited by examiner

METHOD FOR IMAGING BIOLOGICAL MATTER USING AN ADIABATIC PULSE

CROSS REFERENCES TO RELATED APPLICATIONS

The present application claims priority to U.S. Provisional Application No. 60/524,923 filed on Nov. 24, 2003 for "OFF-RESONANCE PREPARATORY RF PULSE FOR MRI IMAGING."

BACKGROUND OF THE INVENTION

1. Field of the Invention

The present application relates generally to magnetic resonance imaging (MRI) and nuclear magnetic resonance (NMR) spectroscopy, and more particularly to using an off-resonance preparatory pulse to enhance MRI sensitivity to $O^{17}$-containing compounds in biological matters.

2. Description of Related Art

Magnetic resonance (MR) results in the absorption and/or emission of electromagnetic energy by nuclei or electrons, and provides the basis of some powerful imaging techniques in medicine. Magnetic resonance imaging (MRI) makes use of resonance properties in some of the nucleus, such as hydrogen nucleus (protons), in biological matters. Other nucleus that can be used for MRI include that of $O^{17}$, which is a naturally occurring, stable isotope of $O^{16}$ (spin 5/2) with a natural abundance (N.A.) of 0.038 atom %. $O^{17}$ is detectable by MRI and is useful for assessing cerebral perfusion in animal studies using direct and indirect MR detection techniques. In the past two decades, several methods based on the use of $O^{17}$ have been proposed for assessing tissue perfusion and functional metabolic imaging of regions with active oxidative metabolism. In nature, $O^{17}$ is found to exist in two states, $O^{17}$ gas and $H_2O^{17}$. Unlike $H_2O^{17}$, $O^{17}$ gas cannot be detected directly using MRI. Thus, extensive research have been conducted to investigate the use of $H_2O^{17}$ as a potential in vivo contrast agent for perfusion studies.

$H_2O^{17}$ is a freely diffusible tracer and safe for human use. However, problems arise in the use of $H_2O^{17}$ for perfusion studies because of its low MR sensitivity. $H_2O^{17}$ also has a low natural abundance (N.A. is 0.038 atom %) and is thus costly to obtain. So, it is not cost effective for patient use if very large doses of $H_2O^{17}$ have to be injected in order to improve the MR sensitivity. Therefore, to detect small concentrations of $H_2O^{17}$ in tissue or biological matter is a prerequisite of an MR technique using $H_2O^{17}$. Conventional MR techniques, however, are either not sensitive to changes in small concentrations of tissue $H_2O^{17}$ or are not practical for use on clinical scanners.

Two types of MR techniques have been proposed to detect $O^{17}$ in biological matters, one is based on direct detection of $H_2O^{17}$ in tissue using NMR spectroscopy, and the other based on signal changes due to effect of $O^{17}$ on the proton signal (indirect detection). Due to low gyromagnetic ratio and short T2 relaxation times of $O^{17}$, direct $O^{17}$ NMR spectroscopy suffers from poor sensitivity at low $H_2O^{17}$ concentrations. See Pekar, J., et al., "In Vivo Measurement of Cerebral Oxygen Consumption and Blood Flow Using 17O Magnetic Resonance Imaging," Magn. Res. Med.: 1991. 21(2): p. 313–9; and Fiat, D., et al., "In Vivo 17O NMR Study of Rat Brain During 17O2 Inhalation," Magn. Res. Med.: 1992. 24(2): p. 370–4.

Some limitations of the direct techniques can be overcome by indirect methods, which are now more popular for MR imaging. See Hopkins, A. L., et al., "Oxygen-17 Contrast agents," Fast imaging techniques, Investigative Radiology, 1988. 23 Suppl 1: p. S240–2. Also, some authors have proposed $O^{17}$ decoupled $^1H$ detection techniques using double tuned coil. See Reddy, R., et al., "17O-Decoupled 1H Detection Using a Double-Tuned Coil," Magn. Res. Imag.: 1996. 14(9): p. 1073–8. A technique based on the $O^{17}$ decoupled $^1H$ detection techniques was successfully used to assess cerebral perfusion in animal cerebral ischemic model. See de_Crespigny, A. J., et al., "MRI of Focal Cerebral Ischemia Using (17)O-Labeled Water," Magn. Res. Med.: 2000. 43(6): p. 876–83. The above mentioned techniques, however, suffer from the disadvantage that some amount of hardware modifications to clinical scanners are required to successfully implement them. Thus, these techniques are not suitable for clinical use.

Recently Arai et al. proposed a T2w (T2 weighted) fast imaging technique, using multi shot Rapid Acquisition with Relaxation Enhancement (RARE) sequences, for assessing cerebral perfusion with bolus injection of $H_2O^{17}$ in animal model on a commercial clinical MR scanner. See Arai, T., et al., "Measurement of Local Cerebral Blood Flow by Magnetic Resonance Imaging: in vivo Auto Radiographic Strategy Using 17O-Labeled Water," Brain Research Bulletin, 1998. 45(5): p. 451–6. In these article, the authors present that RARE based technique allows rapid detection of changes in brain tissue $H_2O^{17}$ concentration. MR techniques based on $T1_\rho$ (T1 rho) dispersion imaging have also been proposed for mapping $H_2O^{17}$ in rodent brain model. See Rizi, R. R., et al., "Proton T1rho-Dispersion Imaging of Rodent Brain at 1.9 T," Journal of Magn. Res. Imag.: 8(5): p. 1090–6. One of the main advantages of these technique is that they can be easily implemented on commercial clinical MR scanners. Unfortunately, these techniques require high power RF preparatory pulses to obtain desired $T1_\rho$ contrast, which may result in increased power deposition in organic tissues and hence increased tissue heating, especially when multi-slice capability is engaged. To overcome the problem, another technique using low power off-resonance RF pulses was proposed by the same authors. See Charagundla, S. R., et al., "Off-Resonance Proton T1rho Dispersion Imaging of 17O-Enriched Tissue Phantoms," Magn. Res. Med.:1998. 39(4): p. 588–95. In this proposal, experiments were performed to characterize $T1_\rho^{off}$ off following off-resonant spin locking in $H_2O^{17}$ enriched phantoms. This off resonance technique, however, was shown to be no better than the on resonance spin locking technique in demonstrating contrast between $H_2O^{17}$ enriched phantoms.

SUMMARY OF THE INVENTION

The present invention includes a method for MR imaging of a biological matter having $H_2O^{17}$ content by performing $T1_\rho^{off}$ imaging of said $H_2O^{17}$ content in said biological matter. In one embodiment of the present invention, the $T1\rho^{off}$ imaging is performed by applying an RF pulse with a resonance frequency offset to said biological matter to create an off resonance spin locking conditions in said biological matter. Thus, parts of the biological matter having different $H_2O^{17}$ concentrations will be differentiated because of their different T2/T1 ratios.

In one embodiment of the present invention, the biological matter is placed in a static magnetic field along a first direction, and the RF preparatory pulse is applied to the biological matter to create an effective magnetic field of a tissue spin system in a second direction. An angle between the first and second directions is substantially near 0°, i.e., the spin lock excitation component the effective magnetic field is substantially greater than the spin tip excitation component. Thus, an off-resonance spin-locking situation is created in which the amount of spin locking increases as the RF pulse gets closer to resonance, and the relaxation behaves according to $T1_\rho^{off}$ times. To crease such a condition, a relatively short and intense RF preparatory pulse is used.

In one embodiment of the present invention, the RF preparatory pulse is a binomial RF pulse with a resonance frequency offset less than about 1000 Hz, or, more preferably, less than about 700 Hz. The duration of the RF pulse is substantially less than 2 ms.

The method can be performed in a commercially available clinical scanner without any hardware modification. The method has been proven to perform well in phantom experiments and live primates, suggesting that the method is feasible as an MR application for clinical imaging.

DETAILED DESCRIPTION OF PREFERRED EMBODIMENTS

It has been known for quite some time that MR signal is sensitive to $H_2O^{17}$. A number of direct and indirect MR methods have been proposed to image $H_2O^{17}$ in phantoms and animal models. Unfortunately a combination of low natural abundance and weak T2 relaxation property of $H^2O^{17}$ requires a large concentration of $H_2O^{17}$ in vivo for high MR sensitivity.

Figure 1A:
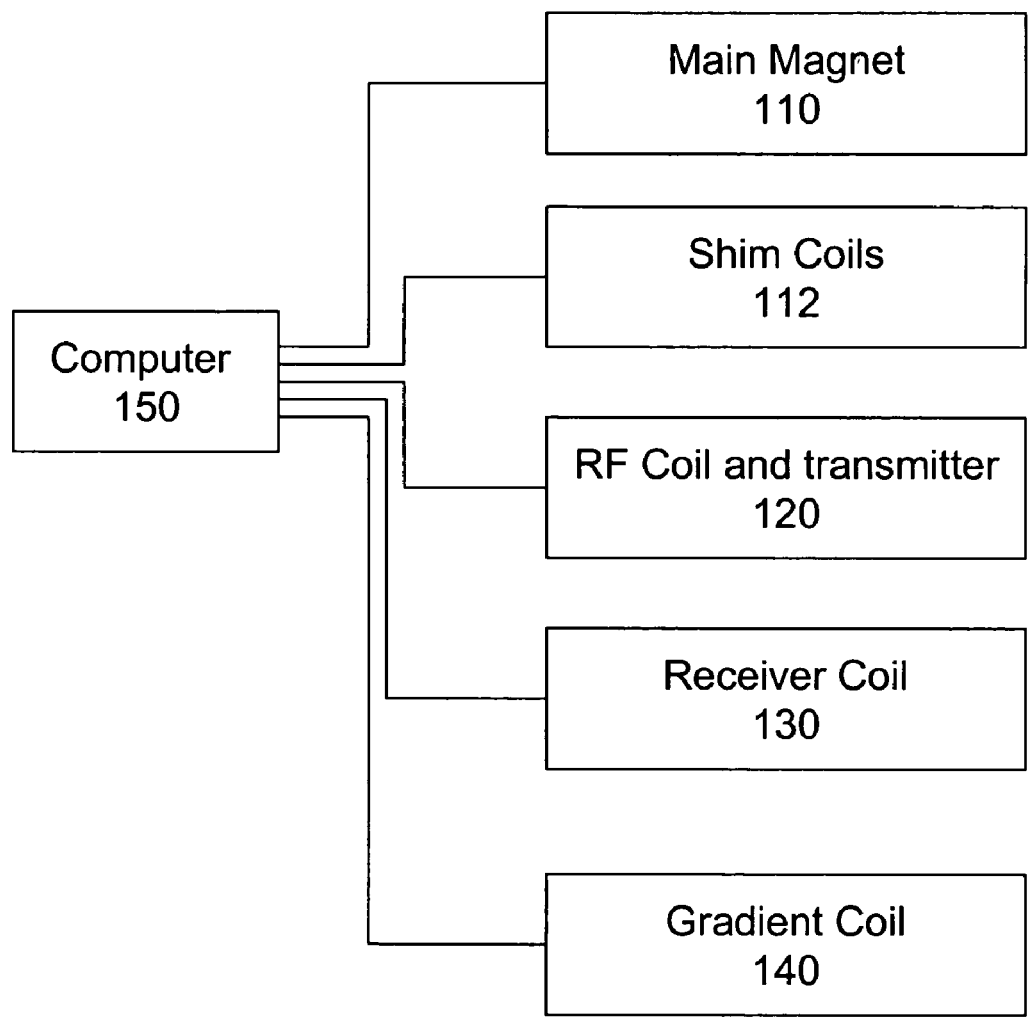
FIG. 1A is a block diagram of major components in a MR imaging system than can be used to implement the method according to one embodiment of the present invention.

According to one embodiment of the present invention, rapid, high sensitivity, and possibly, multi slice imaging of tissue $H_2O^{17}$ can be performed by using a short, intense, binomial preparatory spin-locking pulse with resonance offsets. The imaging can be performed on a conventional clinical MR scanner, such as the 1.5 T OR 3.0 T GE whole body clinical MR imaging systems manufactured by GEMS, Milwaukee, Wis. FIG. 1A illustrates major components of a magnetic resonance imaging (MRI) system 100 that can be used to image a biologic matter containing $O^{17}$, according to one embodiment of the present invention. As shown in FIG. 1A, system 100 includes a main magnet 110 for generating a uniform static magnetic field $B_0$ in the z direction, shim coils 112 to make the static magnetic field as uniform as possible, a radio frequency (RF) coil and transmitter 120 to transmit a preparatory RF pulse into the biological matter, a receiver coil 130 to detect returning radio signals from the biological matter, gradient coils 140 to provide spatial localization of the signal, and a computer 150 to control the operation of the components in system 100 and to reconstruct the received radio signals into images.

Figure 1B:
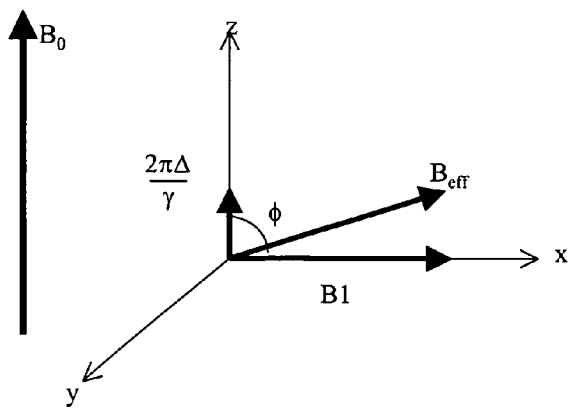
FIGS. 1B and 1C are diagrams illustrating on-resonance and off-resonance spin-locking, respectively, according to one embodiment of the present invention.

MRI makes use of resonance properties found in some of the nucleus present in a biological matter. Only nucleus with an odd number of protons and/or neutrons, such as the $O^{17}$ nucleus, have the magnetic properties required. It is known that each of these nucleus perform spins around its axis giving it magnetic dipole moment (MDM) parallel to the rotation axis. In the static magnetic field $B_0$, the MDM's in the biological matter will experience a force that attempt to align the MDM's to the static magnetic field, either in parallel or anti-parallel. As a result, if $B_0$ is in the z direction, as shown in FIG. 1B, the MDM's will precess about the z direction with an angular frequency $\omega_0$, which is called the Larmor frequency, $$\omega_0 = (\gamma B_0/2\pi) \quad (1)$$

When the preparatory pulse B1, which is typically orthogonal to the direction of $B_0$ is applied to the biological matter, the MDM's are displaced by the RF pulse and will relax and realign with $B_0$ after the RF pulse. Traditional MRI imaging uses T1 and T2 techniques, in which relaxation processes of the MDM's in resonance with the RF preparatory pulse is controlled by the biological parameters T1, namely the spin-lattice relaxation time and T2, namely the spin-spin relaxation time. Preparatory RF saturation pulses in an MR sequence have been proposed as an alternate technique to the T1 and T2 techniques for producing tissue contrast in MR. See Wolff, S. D. and R. S. Balaban, "Magnetization Transfer Contrast (MTC) and Tissue Water Proton Relaxation in vivo," Magn. Res. Med. 1989 10(1) p. 135–44. Spin lock and spin tip excitations are two magnetization components created by the preparatory RF pulses in magnetic contrast enhancement experiments. In a rotating frame formalism as shown in FIG. 1B, the effective RF field $B1_{eff}$ of the tissue spin system, due to an RF pulse having a constant magnetic field amplitude B1 and a resonance offset $\Delta$ (in Hz) can be described by the following relation:

$$B1_{eff} = (B1)x + (2\pi\Delta/\gamma)z \quad (2)$$

Defining $\omega 1$ (Larmor frequency associated with B1) as $$\omega 1 = (\gamma B1/2\pi) \quad (3)$$

Then, $$B1_{eff}=(2\pi\omega1/\gamma)x+(2\pi\Delta/\gamma)z \quad (4)$$

Figure 1C:
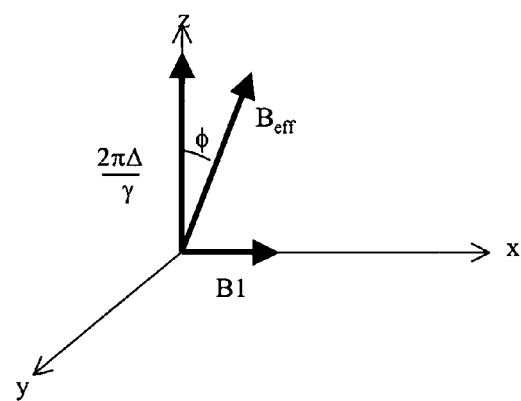

Thus, the ratio of $\omega1/\Delta$ provides a convenient measure of the amount of spin locking and is related to $\phi$, which is the angle between $B1_{eff}$ and the z axis, as shown in FIGS. 1B and 1C. The relation can be written as:

$$\tan\phi=\omega1/\Delta \quad (5)$$

Two situations exist in such a case:

Situation I: $\omega1/\Delta\gg1$, or, $\phi\sim90°$ and $B1_{eff}$ is along the x axis, as shown in FIG. 1B. This situation represents the traditional on-resonance spin locking technique in which, there is little spin locking and relaxation behaves according to T1 times.

Situation II: $\omega1/\Delta\ll1$, or, $\phi\sim0°$ and $B1_{eff}$ is along the z axis, as shown in FIG. 1C. This situation represents an off-resonance spin locking condition in which the amount of spin locking increases as the preparatory RF pulses get closer to resonance with relaxation behavior given by $T1_\rho^{off}$ times.

In both of the above situations, the magnitude of $B1_{eff}$ remains the same while $\omega1$ and $\phi$ change in magnitude. For off-resonance situations, smaller values of $\omega1$ (e.g., $\omega1\leq500$ Hz) are required, as compared to on-resonance spin-locking situation, where $\omega1\geq1$ kHz. Thus, the off-resonance situation implies reduced RF power requirement and hence reduced specific absorption rate (SAR) and tissue heating. Therefore, the off-resonance technique provides an attractive alternate to on-resonance method for $T1_\rho$ ($T1_\rho^{off}$) imaging on existing clinical scanners without exceeding SAR limitations.

Using Bloch equation formalism, a relationship between $T1_\rho$ and T1, T2 relaxation times can be obtained, as expressed in the following equation:

$$1/T1_\rho=1/T1[\sin^2\phi+T1/T2\cos^2\phi] \quad (6)$$

For optimal ($T1_\rho^{off}$) imaging, $\phi$ should change slowly, or $d\phi/dt$ should be small compared with $\gamma B1_{eff}$, so that the total magnetization vector precess in a very tight cone or in some sense 'locked' always about a $\rho$ axis The $\rho$ axis is along a vector represented by the effective magnetic field in the laboratory frame of reference. Such a process will be adiabatic. If $d\phi/dt$ is large compared to $\gamma B1_{eff}$, the lock spin cannot be maintained resulting in a non-adiabatic process. To achieve the adiabatic condition, very short, high amplitude, intense RF preparatory pulses may be used. In one embodiment of the present invention, the duration of the RF preparatory pulse is substantially less than 2 ms, and the amplitude of the RF preparatory pulse, i.e., the magnitude of B1, is greater than about 1 µT. An example of such an RF pulse is found in a binomial RF pulse sequence.

A binomial RF pulse or pulse sequence is a composite RF pulse having subpulses with durations or amplitudes in proportion to a binomial sequence. It may be a constant magnitude rectangular pulse having sub pulses with pulse areas modulated by the coefficients of a binomial series expansion (e.g., one of the form $[1-x]^n$). Binomial RF pulses were initially proposed to produce magnetization transfer (MT) effects as an alternate to continuous wave (CW) techniques. The MT effects can be created by saturating short T2 species to produce a net 0° rotation of long T2 components. Analysis of binomial pulse design by Pike et al., in "Pulsed Magnetization Transfer Spin-Echo MR Imaging," Journal of Magn. Res. Imag. 3(3) p. 531–9, has shown that a 121 binomial pulse provides a good compromise between generating MT contrast and acceptable SAR for in vivo imaging. The MT techniques, however, are based on suppressing magnetization of short T2 species (e.g., $H_2O$ molecules bond to tissue) while sparing the long T2 species to create magnetization transfer from free $H_2O$ molecules to the bond $H_2O$ molecules. The MT techniques are also limited by protein and cholesterol content in tissue. Therefore, the MT techniques cannot be used to image $H_2O^{17}$.

Moran et al., in "Near-Resonance Spin-Lock Contrast," Magn. Res. Imag. 1995, 13(6) p. 837–46, have demonstrated the feasibility of a near-resonance spin locking technique using trapezoidal preparatory RF pulses in phantom experiments, wherein the phantoms include species differing in their T1/T2 ratio. They were able to demonstrate some contrast with a resonance frequency offset less than 500 Hz. Their techniques, however, have to be performed on a specially created MR scanner because trapezoidal pulses are not typically available from a clinical MR scanner. Their techniques are also not practical for clinical use because trapezoidal pulses are longer pulses having slope up, platform, and slope down portions, resulting in wider pulse width and increased scan time, which may also adversely affect the contrast.

In one embodiment of the present invention, second order binomial pulses with resonance frequency offsets are used in off-resonance spin locking ($T1_\rho^{off}$) imaging of biological matters to generate contrast between materials that differ in T1/T2 ratio. Thus, instead of using on-resonance binomial pulses and being limited by SAR, off-resonance binomial RF preparatory pulses with reduced power are used for imaging $H_2O^{17}$ phantoms. It can be seen from equation (5) that with low power (low B1 amplitude) binomial preparatory pulses, $\phi$ can be small enough (Case II: $\omega1/\Delta\ll1$), so that an off-resonance spin locking condition is satisfied. In such a situation, $1/T1_\rho\sim1/T2$, according to equation (5). Thus materials with different T2 relaxation times and similar T1 relaxation times would be expected to affect image contrast with this imaging technique. In other words, factors influencing T1/T2 ratio will be sensitive to this imaging technique. That may be the underlying principle in $T1_\rho^{off}$ imaging $H_2O^{17}$ according to one embodiment of the present invention.

Phantom Experiments

To test the feasibility of the present invention, a phantom was built using Ovalbumin that had a similar T2 (~130 ms) as human brain tissue. Ovalbumin, available as a steam-dehydrated powder (96% purity) from Sigma-Aldrich® was mixed (in concentrations of 5%, 10% and 13%) with 0.9% saline to make a liquid mixture. The mixture was then carefully filtered to remove air bubbles and put into plastic tubes 0.5 cm in diameter. The plastic tubes were then heated by placing them in a water bath (90° C. for 10 minutes) in order to heat the mixture to obtain a tissue like consistency. T1 and T2 measurements were performed on Ovalbumin mixtures with different concentrations of Ovalbumin. It was found that T2 relaxation time of an Ovalbumin mixture with 13% Ovalbumin (137.86±0.4 ms, estimated using conventional spin echo technique at 1.5 T) was similar to that of brain tissues (~150 ms at 1.5 T). The Ovalbumin mixture with 13% Ovalbumin was hence used for all future experiments. The T1 relaxation time of the Ovalbumin mixture was calculated to be 2169.2±34.26 ms at 1.5 T, using a saturation recovery spin echo technique.

The 13% Ovalbumin mixtures were next enriched with different concentrations of $H_2O^{17}$. This was done by doping several 13% Ovalbumin mixtures with 0.038 atom % (T2=137 ms), 0.4 atom %, and 1.0 atom % (T2=100 ms)

$H_2O^{17}$, respectively The enriched mixtures were filtered to remove air bubbles, put into plastic tubes and then heat coagulated in a water bath. The effect of different $H_2O^{17}$ concentrations (0.038 atom %, 0.4 atom %, 1.0 atom %) was investigated by performing serial MR imaging experiments in phantoms.

Two sets of phantom experiments using the $H_2O^{17}$ enriched phantoms were performed on two clinical MR imaging systems, respectively. The two clinical MR imaging systems are 1.5 T and 3.0 T GE whole body clinical MR imaging systems manufactured by GEMS, Milwaukee, Wis. The 1.5 T system includes an extremity RF coil (1.5 T) and the 3.0 T system includes a 9 cm diameter birdcage coil (3.0 T). The first set of experiments performed in the 1.5 T system were carried out to demonstrate the feasibility of the binomial preparatory pulse technique using resonance offsets. The second set of experiments using the 3.T system were carried out to observe the effect of variation of the B1 amplitude in the binomial pulse with resonance frequency offset and to demonstrate the feasibility of the technique with reduced flip angle or B1 amplitude (with resonance offsets). Images using conventional spin echo and Rapid Acquisition with Relaxation Enhancement (RARE) sequences were also acquired on the 1.5 T scanner for comparison. The parameters used for the spin echo sequences are TR/TE 4 s/120 ms, matrix 256×192, FOV 100 mm, slice thickness/gap 3.0/0.0 mm, NEX 1.0, no. slices 7. Similar parameters with effective TE 120 ms and echo train length 16 were used for the RARE sequences.

Figure 1D:
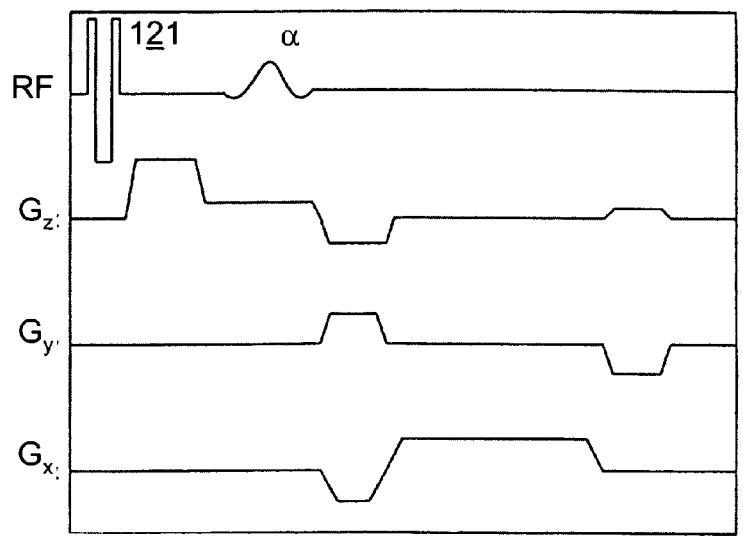
FIG. 1D is a graphical representation of a RF pulse sequence according to one embodiment of the present invention.

The first set of experiments were performed using binomial preparatory pulses with a 3D fast spoiled gradient echo readout, as illustrated in FIG. 1D, where RF is the radio frequency pulse (1_2_1 is the binomial preparatory pulse and α is an excitation pulse), and $G_z$, $G_y$, and $G_x$ are the slice select, phase encoding, and read out gradients respectively. In this set of experiments, the resonance frequency offset for the binomial pulses was varied while the binomial pulse B1 amplitude was kept constant in order to observe the effects of different resonance frequency offsets on the signal intensity of $H_2O^{17}$ phantoms. The transmitter and receiver gains during the phantom experiments were also kept constant. The following parameters were used for the imaging: 3D fast spoiled gradient echo sequence with binomial preparatory pulse, TR/TE 20 ms/1.5 ms, matrix 256×192, FOV 100 mm×100 mm×32 mm, slice thickness 2.0 mm, number of sections 32, flip angle 30°, receiver bandwidth 16 kHz, resonance offset 0 Hz, 10 Hz, 50 Hz, 100 Hz, 200 Hz, 300 Hz and 400 Hz, B1 amplitude 18 μT (corresponding to a flip angle of 276°). An initial image with the preparatory pulse switched off was also obtained for comparison.

In the second set of experiments, the flip angle or B1 amplitude for the binomial pulse was varied and for each flip angle, images with different resonance frequency offsets were obtained. The following parameters were used for imaging: 3D fast spoiled gradient echo sequence with binomial preparatory pulse, TR/TE 20 ms/1.5 ms, matrix 256×192, FOV 100 mm×100 mm×64 mm, slice thickness 2.0 mm, number of sections 32, flip angle 30°, receiver bandwidth 16 kHz, preparatory flip angle (B1 amplitude) varied as 92° (6 μT), 138° (9 μT), 184° (12 μT), 230° (15 μT), 275.8° (18 μT), 322° (21 μT), and 360° (23.49 μT). For each flip angle (B1 amplitude), the resonance frequency offset is varied as 0 Hz, 10 Hz, 50 Hz, 100 Hz, 200 Hz, 300 Hz, 400 Hz, 500 Hz, 600 Hz and 700 Hz. An initial image with the binomial preparatory pulse switched off was also obtained for comparison.

Data from the above experiments was transferred to an offline Ultra SPARC workstation manufactured by Sun Microsystems, Mountain View, Calif., for processing. Region of interests (ROI) were drawn around each phantom tube image using proprietary image analysis software (Advantage Windows made by GEMS). Mean signal intensity values were obtained and data was read into a Microsoft Excel® worksheet for further analysis. The results of the data analysis for the phantom experiments are discussed below in association with FIGS. 2A through 7B.

Figure 2A:
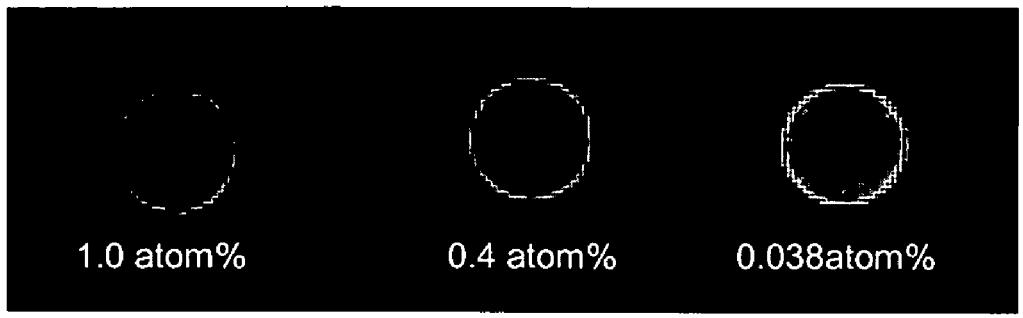
FIGS. 2A and 2B are images of enriched and non-enriched phantoms acquired in phantom experiments using different RF pulse intensity and resonance frequency offset.
Figure 2B:
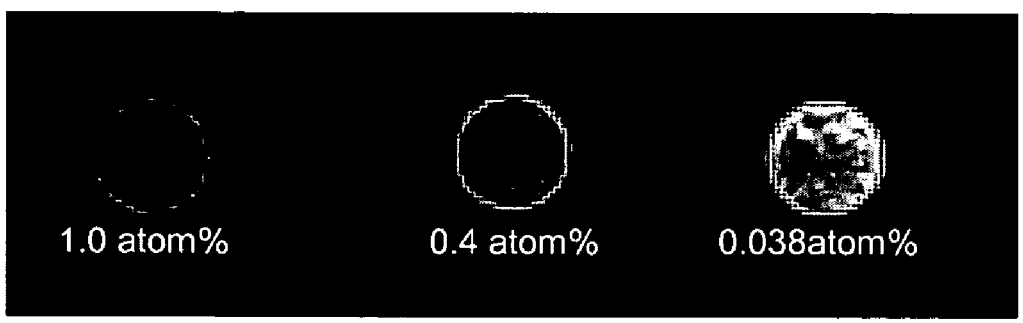

FIGS. 2A and 2B show images of enriched and non-enriched phantoms acquired in the second set of phantom experiments with B1 amplitude at 18 μT and resonance frequency offset at 300 Hz (FIG. 2A) and with B1 amplitude at 6 PT and resonance frequency offset at 600 Hz (FIG. 2B). Note that the contrast between enriched and non-enriched phantoms that can be demonstrated with higher B1 amplitude (smaller resonance offset) can also be achieved with lower B1 amplitude and larger resonance frequency offset.

Figure 3A:
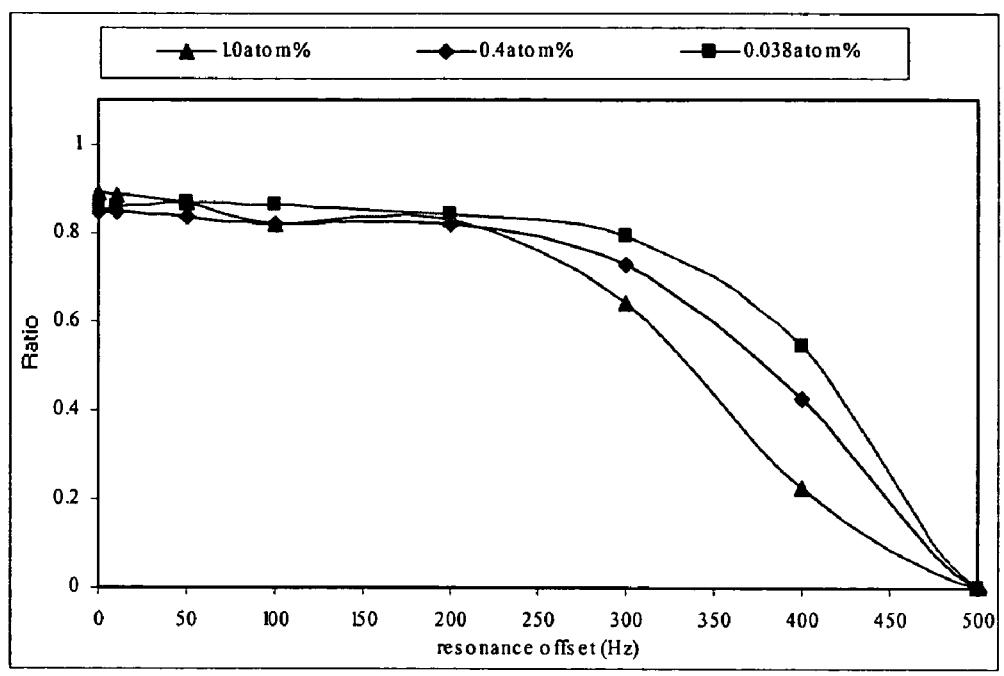
FIGS. 3A and 3B are plots of mean signal intensity ratios obtained in the phantom experiments using a 1.5 T and 3.0 T MR imaging systems, respectively, when the offset frequency is varied between 0 and 500 Hz.
Figure 3B:
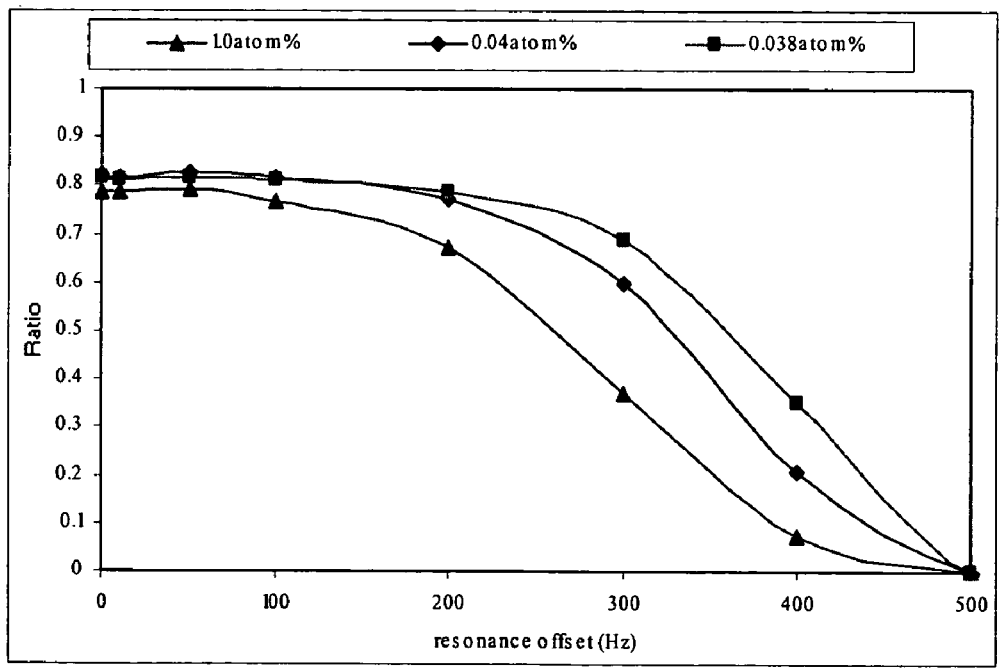

FIG. 3A shows a plot of the ratio of mean signal intensity obtained when the offset frequency is between 0 and 500 Hz to that obtained when the offset frequency is set at 0 (S.I.[offset]/S.I.[offset=0], where S.I. stands for mean signal intensity), for phantoms at concentrations 0.038 atom % (N.A.), 0.4 atom % and 1.0 atom %. The B1 amplitude is set at 18 μT (corresponding to a flip angle of 276°) at 1.5 T. FIG. 3B shows a similar plot at 3.0 T. The plots in FIGS. 3A and 3B show that the signal intensity ratio decreases with increased resonance frequency offset.

Figure 4A:
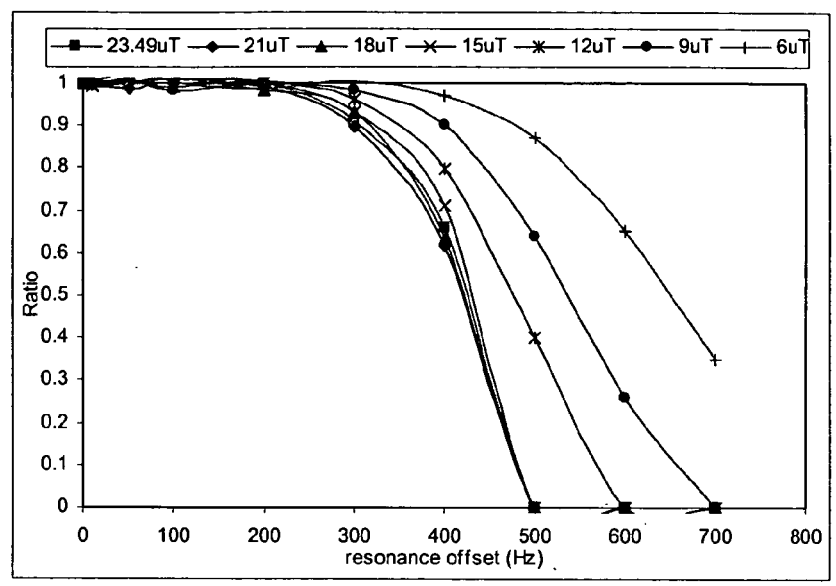
FIGS. 4A–4C are plots of mean signal intensity ratio vs. resonance frequency offset at different RF pulse intensity for enriched Ovalbumin phantoms of 0.038 atoms % (N.A.) $H_2O^{17}$, 0.4 atoms % $H_2O^{17}$, and 1.0 atoms % $H_2O^{17}$, respectively.
Figure 4B:
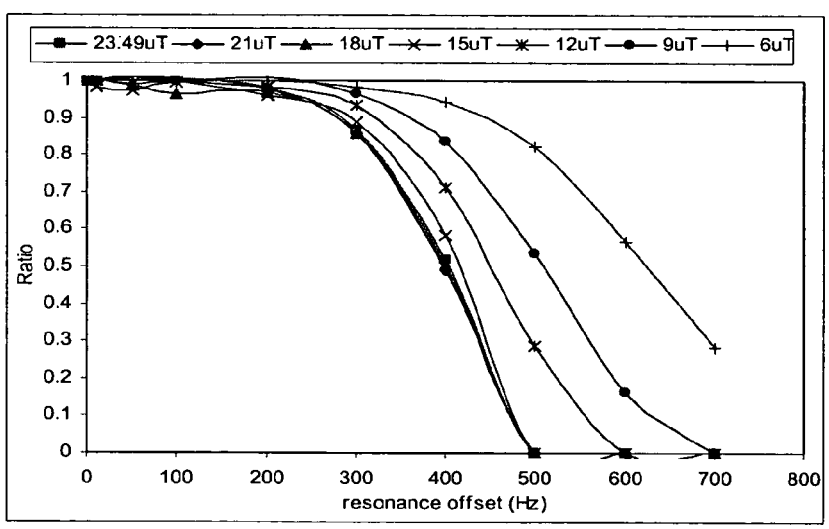
Figure 4C:
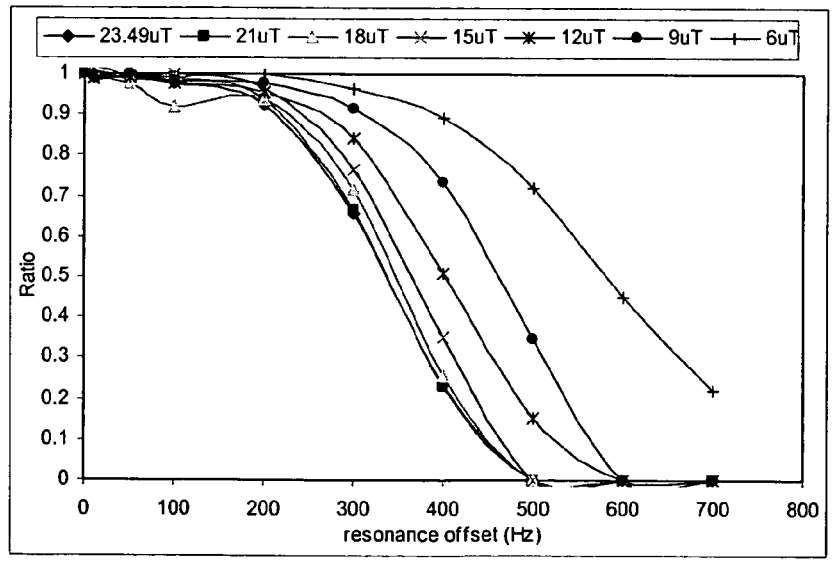

The effect of varying preparatory pulse B1 amplitudes on phantoms with different concentrations of $H_2O^{17}$ is illustrated in FIGS. 4A–4C, which are plots of S.I.[offset]/S.I. [offset=0] ratio vs. resonance frequency offset (0–700 Hz) at different B1 magnitude for enriched Ovalbumin phantoms of 0.038 atoms % (N.A.) $H_2O^{17}$ (FIG. 4A), 0.4 atoms % $H_2O^{17}$ (FIG. 4B), and 1.0 atoms % $H_2O^{17}$ (FIG. 4C). The data for the plots are obtained at 1.5 T, i.e., in the first set of experiments. As shown by the plots, =the mean signal intensity ratio decreases with increasing B1 amplitude. At smaller resonance frequency offsets, the difference between mean signal intensity ratios at different B1 magnitudes are smaller as compared to that at higher resonance offsets where the curves are more distinct and further apart. The plots suggest that resonance offsets of greater than 500 Hz should only be used with lower B1 amplitudes (≦12 μT), and that up to 700 Hz offset frequency can be used with a B1 amplitude of 6 μT.

FIGS. 4A–4C also show that higher B1 amplitude pulse with smaller resonance offset (e.g., 23.49 μT/300 Hz for 1.0 atom %) will produce a similar mean signal ratio (S.I. ratio=0.23) as lower B1 amplitude pulses with high resonance frequency offset (6 μT/700 Hz for 1.0 atom % and S.I. ratio=0.22). Thus a high B1 amplitude pulse requires a smaller resonance offset to generate similar effects as low B1 amplitude pulse (and larger offset). This result has useful practical implications, as discussed further below.

Also shown in FIGS. 4A–4C, as the $H_2O^{17}$ concentration increases in the enriched phantoms, the curves in the plots fall more gradually with increased resonance frequency offset at higher resonance frequency offsets. Furthermore, a decrease in mean signal intensity ratio is observed with increasing $H_2O^{17}$ concentration in the enriched phantoms. For example, at B1=18μT and resonance frequency offset=400 Hz, S.I. ratio is about 0.64 for 0.038 atom % (N.A.), 0.53 for 0.4 atom %, and 0.34 for 1.0 atom %.

Figure 5A:
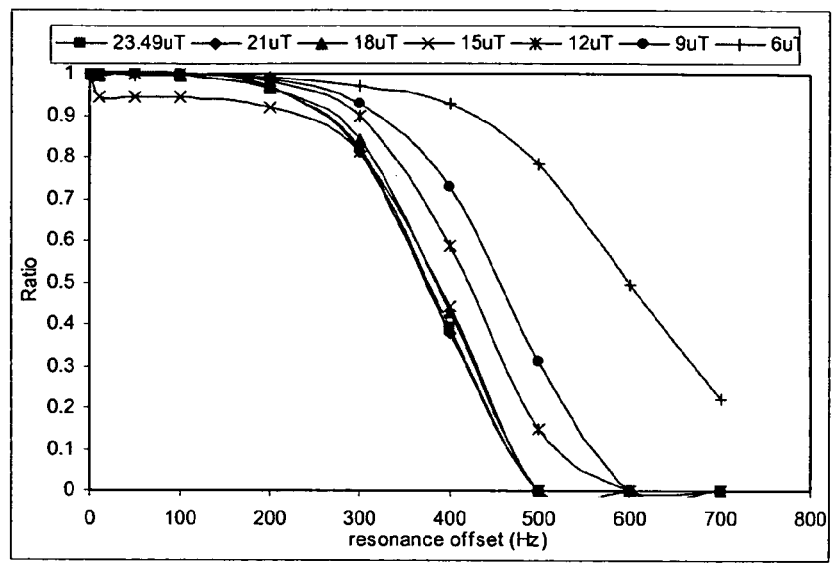
FIGS. 5A–5C are plots of mean signal intensity ratio vs. resonance frequency offset at different RF pulse intensity values for enriched Ovalbumin phantoms of 0.038 atoms % $H_2O^{17}$, 0.4 atoms % $H_2O^{17}$, and 1.0 atoms % $H_2O^{17}$, respectively.
Figure 5B:
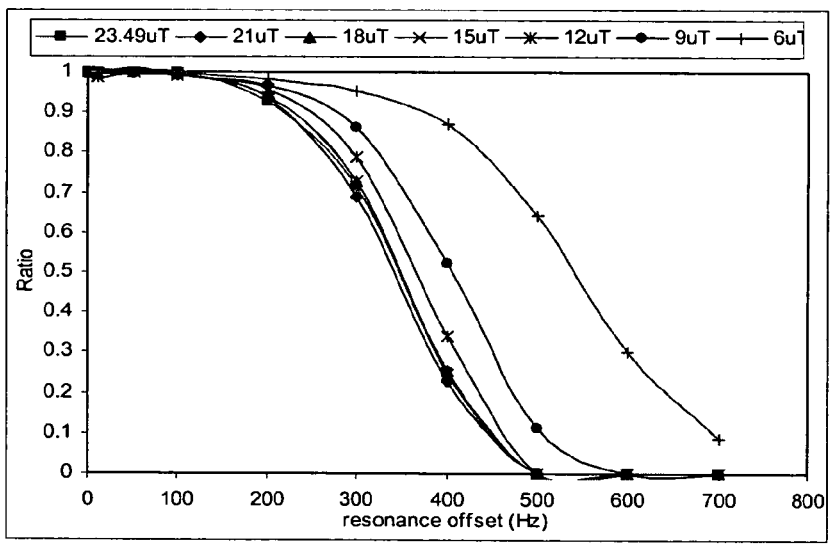
Figure 5C:
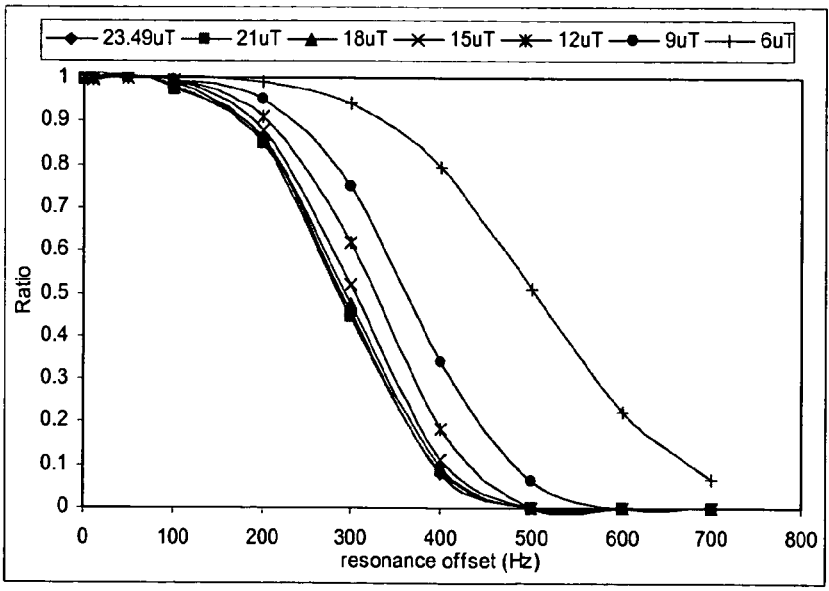

FIGS. 5A–5C are plots of S.I.[offset]/S.I.[offset=0] ratio vs. resonance frequency offset (0–700 Hz) at different B1 magnitude for enriched Ovalbumin phantoms of 0.038 atoms % $H_2O^{17}$ (FIG. 5A), 0.4 atoms % $H_2O^{17}$ (FIG. 5B), and 1.0 atoms % $H_2O^{17}$ (FIG. 5C). The data used for the plots was acquired at 3.0 T. Similar to results obtained at 1.5 T, a decrease in mean signal intensity ratio is observed with increasing $H_2O^{17}$ concentration in the enriched phantoms. On close comparison of individual plots (FIG. 4A with FIG. 5A, FIG. 4B with FIG. 5B, and FIG. 4C with FIG. 5C), however, it is clear that the S.I. ratio is higher for a given B1 amplitude and resonance offset at 1.5 T than that at 3.0 T for each type of enriched phantom. For example, for 1.0 atom % enriched phantom, B1 amplitude 18 μT, and resonance offset frequency 300 Hz, the ratio is 0.72 at 1.5 T as compared to 0.47 at 3.0 T.

Figure 6A:
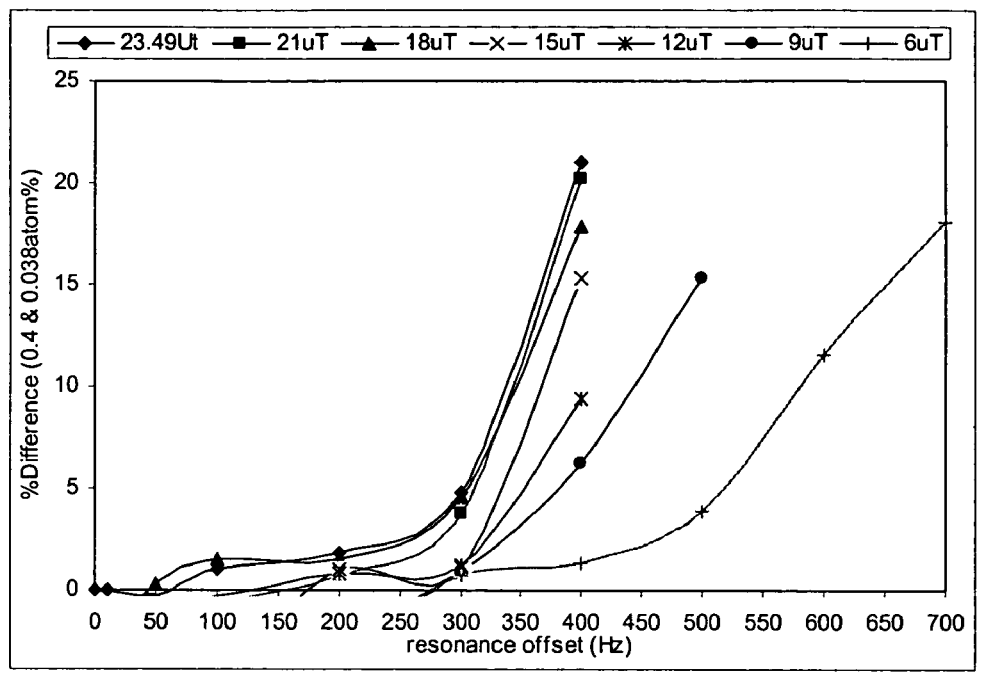
FIGS. 6A and 6B are plots of percentage difference in mean signal intensity between enriched phantoms of different $H_2O^{17}$ concentrations versus resonance frequency offset for various RF pulse intensity values at 1.5 T.
Figure 6B:
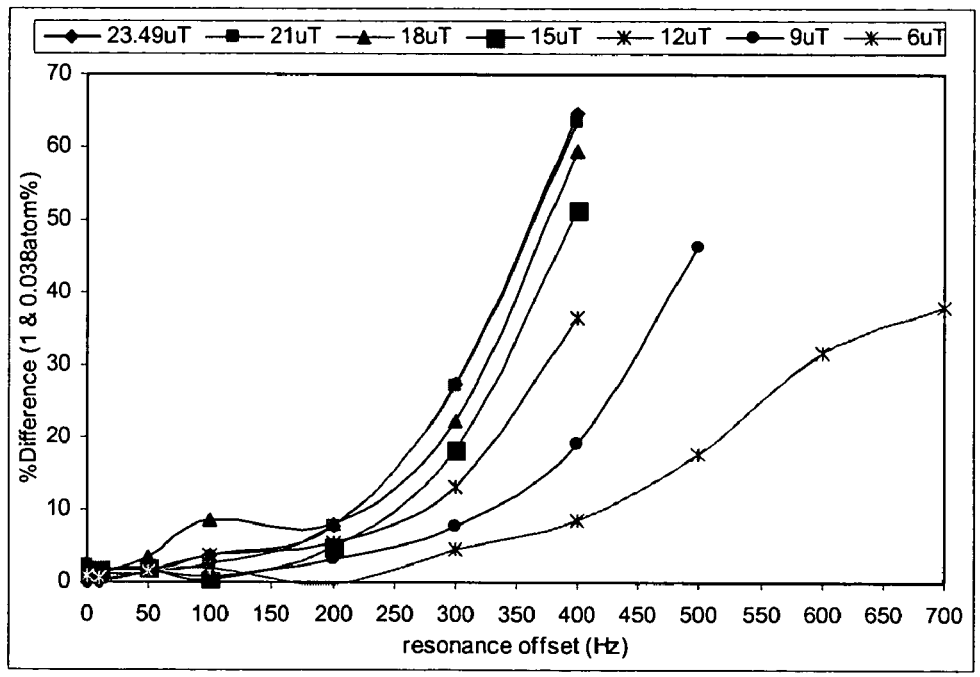

Plots of percentage difference in mean signal intensity between enriched phantoms of different $H_2O^{17}$ concentrations versus resonance frequency offset for various B1 amplitudes and at 1.5 T are shown in FIG. 6A (0.4 atom % and 0.038 atom %) and FIG. 6B (1.0 atom % and 0.038 atom %), respectively. The plots demonstrate the following features: (1.) a higher percentage difference for higher concentration difference of $H_2O^{17}$, (2.) an increase in percentage difference with an increase in resonance frequency offset wherein the effect is greater at offsets beyond 300 Hz, (3.) a higher percentage difference for larger B1 amplitudes, and (4.) resonance offsets of 700 Hz not achieved with B1 amplitude greater than 6 μT.

Figure 7A:
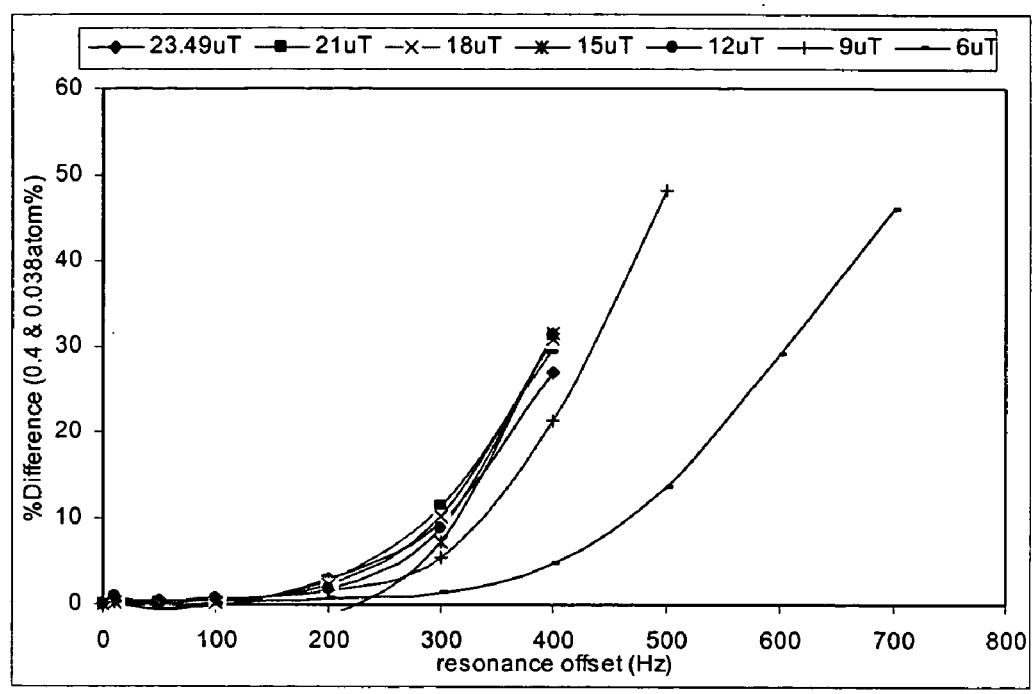
FIGS. 7A and 7B are plots of percentage difference in mean signal intensity between enriched phantoms of different $H_2O^{17}$ concentrations versus resonance frequency offset for various RF pulse intensity values at 3.0 T.
Figure 7B:
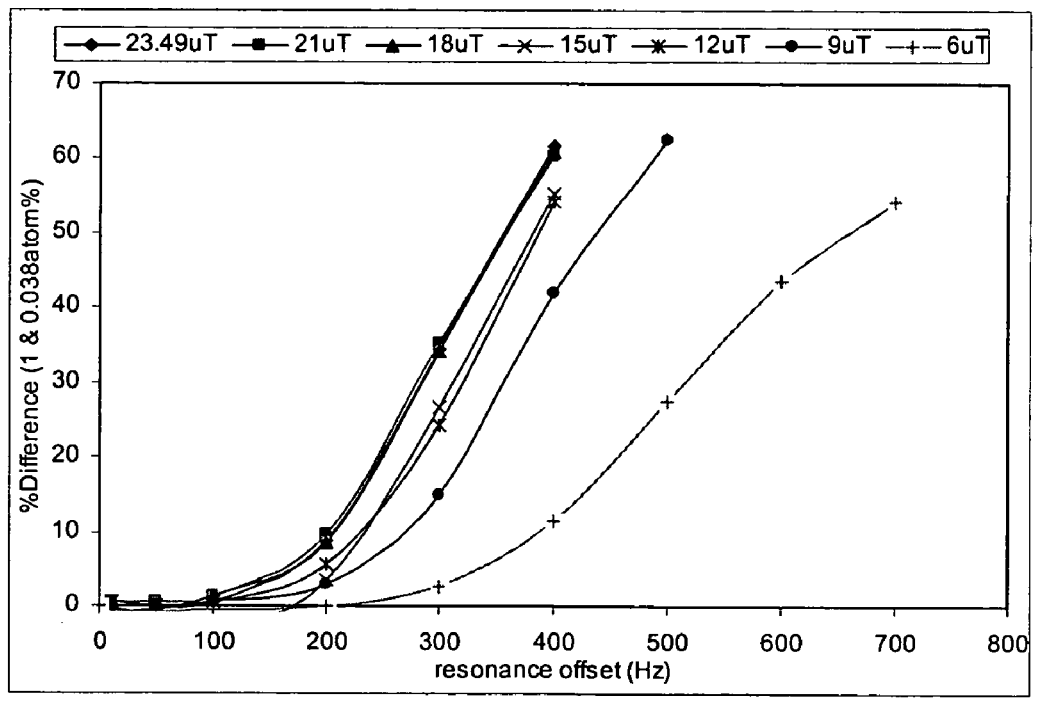

Similar plots for 3.0 T are shown in FIGS. 7A and 7B, which show a higher percentage difference as compared to 1.5 T for a given B1 amplitude, resonance offset frequency and $H_2O^{17}$ concentration difference. For example, a 51.3% difference and a 15.2% difference were observed at 1.5 T for $H_2O^{17}$ concentration difference between 1.0 atom % and 0.038% atom and for $H_2O^{17}$ concentration difference between 0.4 atom % and 0.038 atom %, respectively as compared to 55.7% and 31.6% for the same concentration differences at 3.0 T, when the B1 amplitude is at 12 μT and the resonance offset frequency at 400 Hz. The features listed above for 1.5 T hold true for FIGS. 7A and 7B. As expected, the mean signal intensity values at 3.0 T were much higher compared to 1.5 T.

Phantom experiments as the ones discussed above are useful to assess feasibility of the present invention and to optimize the parameters used in one embodiment of the present invention. Ovalbumin was the material of choice for building the phantoms since it has tissue like properties (with respect to MR) when heat coagulated. For those interested in imaging the human brain, the phantom properties can be closely simulated to brain tissue. The phantom was easy to build, robust, portable and inexpensive for routine MR research. Ovalbumin used in this study was of scientific grade and of very high purity (~96%), as the results obtained would reflect properties of the phantom (ovalbumin) and/or the contrast agent (enriched phantoms). No other doping agent was mixed with ovalbumin to modify phantom properties (such as T1, T2 and consistency). One of the disadvantages of using Ovalbumin for building phantoms is that the phantoms may get infected and thus, have a relatively limited shelf life. It is possible to dope the phantoms with extraneous microbicidal agents (such as sodium azide), but due to the possibility of such an agent influencing results, it was not used.

The above results from the phantom study illustrate the operation of one embodiment of the present invention. Initial plot (FIGS. 3A and 3B) of mean signal intensity ratio (S.I.[offset]/S.I.[offset=0]) versus resonance offset with a single B1 amplitude (18 μT, flip angle 276°) shows that each phantom type (1.0 atom %, 0.4 atom % and 0.038 atoms % or N.A) had a distinct curve, more so at higher resonant offsets. The maximum distinction between curves was seen at frequency offset 400 Hz, where the ratios for 1.0 atom %, 0.4 atom %, and 0.038 atom % were 0.25, 0.50 and 0.63, respectively, at 1.5 T, and 0.09, 0.25 and 0.43, respectively, at 3.0 T. The lower ratios at 3.0 T compared to 1.5 T probably suggests higher sensitivity to phantom $H_2O^{17}$ concentrations at higher static field strengths. High B1 amplitude used in the experiments confirmed that optimal spin locking condition could be satisfied. When lower B1 amplitudes (e.g., B1=18μT) for the preparatory pulse were used at 1.5 T and 3.0 T (FIGS. 4A–4C and FIGS. 5A–5C, respectively), similar S.I. ratio values were observed at higher values of resonance offsets. As another example, a 9 μT B1 amplitude preparatory pulse with a resonance offset of 500 Hz produced S.I. ratio values of 0.34, 0.53 and 0.64 at 1.5 T and 0.06, 0.11 and 0.31 at 3.0 T for 1.0 atom %, 0.4 atom %, and 0.038 atom % of $H_2O$, respectively. Similar results were observed with a 6 μT B1 amplitude preparatory pulse combined with a resonance offset of 600 Hz. As discussed before, an effect (a certain S.I. ratio value) observed at a higher B1 amplitude combined with a smaller resonance offset, could be achieved with a lower B1 amplitudes and a larger resonance offsets. In the plots discussed above, S.I. ratio values were plotted instead of absolute signal intensity values, because this would normalize signal variations due to the preparatory pulses and also make analysis simpler.

Because the percentage differences in signal strength between enriched and N.A. phantoms with high B1 amplitudes and low resonance offsets could be reproduced at low B1 amplitudes and large resonance offsets, a phenomenon consistently demonstrated at 1.5 T and 3.0 T, low B1 amplitude preparatory pulse with large resonance offset can be good enough to detect small changes in tissue $H_2O^{17}$. Since one of the disadvantages of using high B1 amplitude preparatory pulse is tissue heating from power deposition in human subjects, which is manifested as SAR limitations on clinical scanners, the present invention offers a remedy to that problem as lower B1 amplitude preparatory pulses with larger resonance offsets may be used to in place of higher B1 amplitude preparatory pulses with smaller resonance offsets to achieve the same sensitivity to $H_2O^{17}$. Another advantage of using lower B1 amplitude preparatory pulses is that it is less demanding on radio frequency amplifiers associated with the RF transmitter 120. However, the B1 amplitude should be high enough so that spin locking condition (Case II condition) is satisfied, as discussed above.

The ability to differentiate between smaller concentrations of $H_2O^{17}$ using the proposed technique have important consequences, since this means signal intensity changes can be detected with low tissue concentrations of $H_2O^{17}$, thus smaller doses of $H_2O^{17}$ is required for clinical use. FIGS. 6A, 6B, 7A and 7B clearly demonstrate the important feature of the phantom experiments that small concentrations of $H_2O^{17}$ can be differentiated using the techniques of the present invention. A higher percentage difference in signal strength between enriched and N.A. phantoms observed at 3.0 T probably indicates greater sensitivity to $H_2O^{17}$ at higher field strengths.

An advantage of using 3.0 T instead of 1.5 T static magnetic field would be higher signal to noise (SNR) and better image quality, which was also observed in our experiments.

In summary, binomial preparatory pulses was successful in differentiating both 1.0 atom % and 0.4 atom % $H_2O$ from phantom with N.A. of $H_2O$. With optimal parameters, a 60% S.I. difference between 1.0 atom % & N.A. and 40% S.I. difference between 0.4 atom % and N.A. were observed. To compare with the results obtained in the above phantom experiments, conventional spin echo and RARE images of the enriched phantoms were acquired at 1.5 T. As a result, a 13.9% difference in S.I. was obtained between 1.0 atom % & N.A., and a 0.7% difference in S.I. was obtained between 0.4 atom % and N.A., using the conventional spin echo sequence. With the RARE sequence, a 5.5% difference between 1.0 atom % & N.A was observed, and no significant difference was observed between 0.4 atom % and N.A. Conventional spin echo has a fair amount of sensitivity for detecting $H_2O^{17}$ tissue concentration, but due to its long acquisition times, it is not optimal for imaging in a clinical setup. RARE technique was successful in detecting 1.0 atom % $H_2O^{17}$ but was not sensitive enough to detect 0.4 atom % $H_2O$. MR techniques based on multi shot RARE sequences also suffer from blurring at edges that are more severe at longer echo train lengths, which is essential for rapid imaging and increased sensitivity to T2 relaxation decay. Most of all, RARE and conventional spin echo techniques are at least a factor of two less sensitive than the techniques using off resonance binomial preparatory pulses according to one embodiment of the present invention, as demonstrated by the first and second sets of phantom experiments discussed above. Therefore, the results obtained from the phantom experiments were very encouraging and stimulated further validation studies using a primate brain model.

Primate Experiments

A squirrel monkey weighing 881 gms was selected for the primate experiments. Animal ethics committee approval for the primate study was obtained prior to the experiments. The primate was anesthetized with a pre-anesthetic injection of 0.17 ml of ketamine, 0.17 ml of xylazine, and 0.065 ml of atropine, given as a subcutaneous injection. The primate was then positioned in a bird cage RF coil and imaged with the primate head in the isocenter of the main magnet (and RF coil). All through the duration of the study the monkey was anesthetized using isoflurane gas and physiological monitoring was performed at constant time intervals. The experiments were performed by acquiring imaging data using the off-resonance binomial pulses according to one embodiment of the present invention, both before and after $H_2O^{17}$ injection.

All of the primate experiments were performed on the 3.0 T whole body clinical MR scanner, using a bird cage RF coil (diameter 9.5 cm). RF transmitter and receiver gains during the experiments were kept constant for each set of parameters. Initial localizer images were obtained using the following parameters: 2D fast spoiled gradient echo sequence, 3-plane, TR/TE 10 ms/1.5 ms, matrix 256×192, FOV 120 mm×120 mm, slice thickness 5.0 mm, inter slice gap 0.0 mm, number of slices 5 per plane, flip angle 12°, and receiver bandwidth 62.5 kHz.

After acquiring the localizer images, two sets of data were obtained. The first set of data were obtained before the $H_2O^{17}$ injection and the second set of data obtained after the $H_2O^{17}$ injection. Pre-injection data (with and without preparatory pulse) was acquired using the following parameters: 3D fast spoiled gradient echo sequence with binomial preparatory pulse, TR/TE 18 ms/1.5 ms, extremity coil, matrix 256×192, FOV 120 mm×120 mm×24 mm, slice thickness 3.0 mm, number of sections 8, flip angle 30°, NEX 2.0, receiver bandwidth 32 kHz, and preparatory flip angle (B1 amplitude) 276° (18 µT) with resonance offset 300 Hz.

For post-injection data acquisition, 1.8 cc of 40 atom % $H_2O^{17}$ was infused into the primate over a 56 second period of time using an intravenous catheter. Imaging was performed during the infusion and afterwards. The acquisition time for each scan was 52 seconds while the duration between two consecutive scans was 1 minute. Scans with preparatory pulse switched off were also acquired, interleaved with scans with the preparatory pulse turned on for comparison. Pre- and post-injection images using RARE sequence were also acquired at certain intervals for comparison with the preparatory pulse technique. The total duration for the experiments was 22 minutes.

Extra data set with low B1 values was not obtained in the experiments due to time constraints and nature of the experiments. The time constraints were mainly influenced by duration of anesthesia, maintenance of the primate body warmth and the general well being of the primate. Also, some amount of time was spent in setting up the scanner for the primate experiments, anesthetizing the primate, and setting up optimal parameters for preparatory RF pulses. Hence, the primate experiments were performed with only one B1 amplitude and resonance offset, which were selected based on the results of the phantom experiments, as discussed above.

Images acquired during the primate experiments using the preparatory RF pulses according to one embodiment of the present invention are shown in FIGS. 8A–8E, 9A–9C, 10A–10C, 11A –11C, and 12A–12C. FIGS. 8A–8E are images acquired for a same location of the primate brain while keeping the receiver and transmitter gain constant. Table I below lists the conditions under which the images are taken.

TABLE I

Figures 8A, 8B, 8C, 8D, 8E:
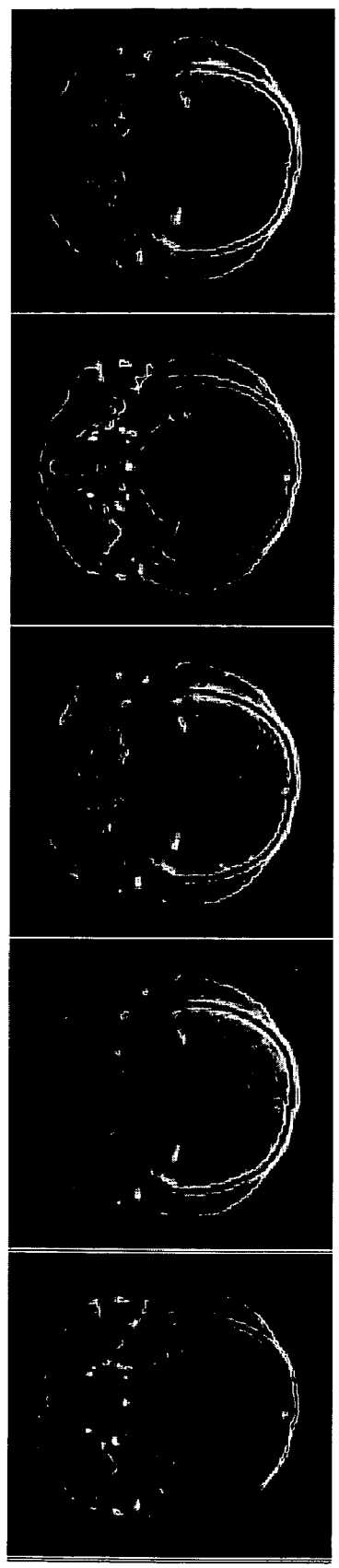
FIGS. 8A–8E, 9A–9C, 10A–10C, 11A–11C are MR images and difference images acquired for a same location of a primate brain during primate experiments

| | Pre-injection | Post-injection | Pulse OFF | Pulse ON |
|---|---|---|---|---|
| FIG. 8A | x | | x | |
| FIG. 8B | x | | | x |
| FIG. 8C | | x | | x |
| FIG. 8D | | x | x | |
| FIG. 8E | | x | | x |

When the preparatory pulse in switched on (FIGS. 8B, 8C, and 8E), binomial pulse amplitude B1 is 18 µT and the resonance offset frequency is set at 300 Hz. Both FIGS. 8C and 8E are post-injection images acquired with the preparatory pulse switched ON, but there is a fall in signal in FIG. 8C because the post-injection image in FIG. 8C was acquired 540 seconds after the injection. A post injection image with the preparatory pulse switched OFF was acquired for comparison, as shown in FIG. 8D. Note that there is no qualitative change in signal intensity between the pre-injection image in FIG. 8A and the post-injection image in FIG. 8D when the preparatory pulse is switched off. FIG. 8D demonstrates the effect of the preparatory pulse when it is again switched ON.

Figures 9A, 9B, 9C:
Figures 10A, 10B, 10C:

FIGS. 9A and 9B are the same images as FIGS. 8B and 8C, respectively. FIG. 9C shows a difference image obtained by algebraically subtracting pre-injection image (FIG. 9A) from the post-injection image (FIG. 9B) acquired with the preparatory pulse switched ON. The calculated percentage difference in mean signal intensity from the difference image was 42.97%. As a comparison, a difference image using the RARE technique is shown in FIG. 10C, which was obtained by algebraically subtracting a pre-injection image (FIG. 10A) from a post-injection image (FIG. 10B), both obtained using RARE sequences having the following parameters:

TR/TE 2.5 s/120 ms (TE is effective TE), ETL 32, and echo spacing 7.0 ms. The percentage difference in mean signal intensity between the pre- and post-injection images with the RARE sequences and with the binomial preparatory pulse switched OFF was 6.7%, much smaller that obtained using the preparatory pulses according to one embodiment of the present invention. Therefore the preparatory pulse technique according to one embodiment of the present invention was much more sensitive to $H_2O^{17}$ than the RARE technique.

Figure 11A:
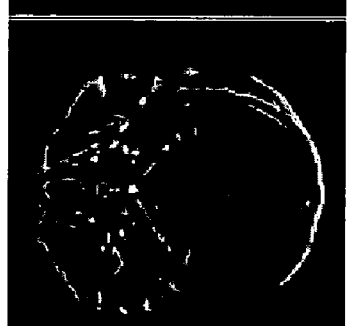
Figure 11B:
Figure 11C:
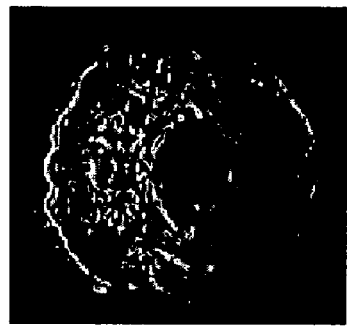

FIG. 11A is the same image as FIG. 8A, which is the pre-injection image of the primate brain acquired with the preparatory pulse switched OFF. FIG. 1B is the same image as FIG. 8D, which is the post-injection image of the primate brain acquired with the preparatory pulse switched OFF. FIG. 11C is a difference image obtained by algebraically subtracting the pre-injection image (FIG. 11A) from a post-injection image (FIG. 11B). As shown in FIG. 11C, when the preparatory pulse is switched OFF, few detectable tissue changes can be observed, suggesting that the preparatory pulse was creating a spin lock condition making it sensitive $H_2O^{17}$. When the preparatory pulse was switched ON again, a fall in tissue signal intensity was again observed in FIG. 8E. This suggests that the preparatory pulse was uniquely responsible for the effect.

There was some speculation that magnetization transfer mechanism might have played some role in generating the contrast observed, but such a speculation was invalidated because, in the phantom experiments, mean signal intensity ratios defined as S.I.[offset]/S.I.[offset=0] were plotted to demonstrate that the effect was only due to $H_2O^{17}$. Similarly, in the primate experiments, percentage difference (43%) in contrast between pre- and post-injection images was estimated with preparatory pulse switched ON (B1 amplitude 18 μT and resonance frequency offset 300 Hz). It could be argued that the use of off resonance pulses may be responsible for generating magnetization transfer contrast between enriched and N.A. phantoms. However, such a possibility was also ruled out based on the experiment performed by Charagundla et al., supra, in which the authors clearly demonstrated that $H_2O^{17}$ (in enriched phantoms) had no effect on z-spectra, obtained using a saturation pulse-acquire technique. Moreover, it is well documented that magnetization transfer effects are optimal at higher resonance frequency offsets ($\geq 2$ kHz), while in experiments according to one embodiment of the present invention, lower resonance frequency offsets ($\leq 700$ Hz) have been used.

The primate brain images acquired in the primate experiments using the preparatory pulses show a somewhat 'wash out' effect, i.e., a loss in gray and white matter contrast. Such an effect was not observed in the phantom experiments. The effect could be attributed to the high B1 amplitude preparatory pulses used to satisfy a spin locking condition in the primate experiments. Such high RF power pulses could directly saturate the tissue signals, resulting in a loss of inherent tissue contrast. However, as demonstrated by the phantom experiments, it is possible to use lower B1 amplitude pulses to prevent saturation of tissue signals and at the same time maintain sensitivity to tissue $H_2O^{17}$ by choosing a larger resonance frequency offset. Unfortunately due to time constraints (discussed earlier), low B1 amplitude (and larger resonance offset) images were not acquired.

Figure 12A:
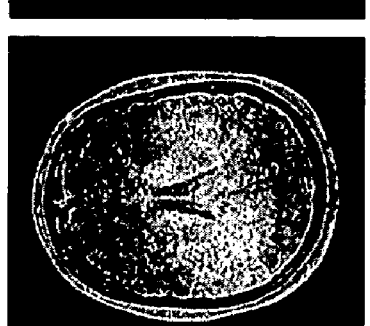
FIGS. 12A–12C are MR images of a human brain acquired under different conditions, using the method according to one embodiment of the present invention.
Figure 12B:
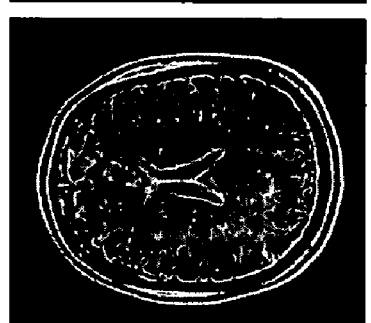
Figure 12C:
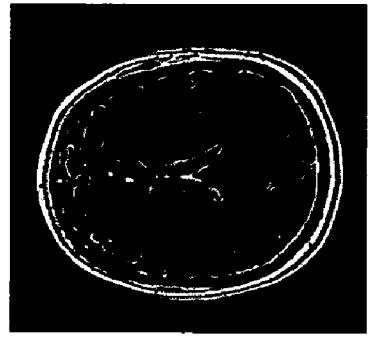

Nevertheless, more images were acquired in a human volunteer, using the preparatory pulses with different B1 amplitudes, according to one embodiment of the present invention. FIGS. 12A–12C show the MR images of the human brain acquired using the binomial preparatory pulse technique with B1 amplitude at 18 μT and offset frequency at 300 Hz (FIG. 12A), with B1 amplitude at 6 μT and offset frequency at 400 Hz (FIG. 12B), and with B1 amplitude at 3 μT and offset frequency at 500 Hz (FIG. 12C). Note that the gray-white contrast in the brain parenchyma is better with lower B1 and higher resonance frequency offset than with higher B1 and lower resonance frequency offset. Thus, it is possible to achieve relatively high sensitivity to $H_2O^{17}$ and also have a high gray-white matter contrast using the preparatory pulse technique according to one embodiment of the present invention.

Thus a method to detect $H_2O^{17}$ that uses a binomial preparatory pulse with a resonance offset frequency combined with a fast imaging sequence to perform rapid multi slice imaging on a commercial clinical imaging system is disclosed according to one embodiment of the present invention. The method includes performing $T1_\rho^{off}$ imaging of tissue $H_2O^{17}$, which is unheard of prior to the present invention and which allows detection of tissue $H_2O^{17}$ with relatively high sensitivity. Because of the high sensitivity, a small dose (e.g., <10 cc, 40 atom %) of $H_2O^{17}$ is required to be administered in a human subject being imaged. The method was successfully implemented, without any modification to the system hardware, on a commercially available clinical scanner at 1.5 T and 3.0 T static magnetic field strengths. The method has also been shown to perform well in phantom experiments and live primates, suggesting that the method should be feasible as an MR application for clinical imaging.

The invention claimed is:

1. A method for MR imaging of a biological matter having $H_2O^{17}$ content, comprising:
   applying an adiabatic RF pulse with a resonance frequency offset to said biological matter; and
   performing $T1_\rho^{off}$ imaging of said $H_2O^{17}$ content in said biological matter.

2. The method of claim 1 wherein performing $T1_\rho^{off}$ imaging of said $H_2O^{17}$ content in said biological matter comprises differentiating parts of said biological matter having different $H_2O^{17}$ concentrations by creating off resonance spin locking conditions in said biological matter.

3. The method of claim 2 wherein differentiating parts of said biological matter having different $H_2O^{17}$ concentrations comprises differentiating parts of said biological matter having different T1/T2 ratios.

4. The method of claim 1 wherein the resonance frequency offset is less than about 1000 Hz.

5. The method of claim 1 wherein the resonance frequency offset is less than about 700 Hz.

6. The method of claim 1 wherein duration of said RF pulse is substantially less than 2 ms.

7. The method of claim 1 wherein said RF pulse is a second order binomial RF pulse.

8. The method of claim 1 performed in a clinical scanner.

9. A method of imaging a biological matter to differentiate parts of said biological matter having different concentrations of a particular compound, comprising:
   placing said biological matter in a static magnetic field along a first direction; and
   applying an adiabatic RF pulse to said biological matter to create an effective magnetic field of a tissue spin system in a second direction, wherein an angle between said first and second directions is substantially near 0°.

10. The method of claim 9 wherein said RF pulse has a resonance frequency offset less than about 1000 Hz.

11. The method of claim 10 wherein the resonance frequency offset is less than about 700 Hz.

12. The method of claim 9 wherein duration of said RF pulse is substantially less than 2 ms.

13. The method of claim 9 wherein said RF pulse is a binomial RF pulse.

14. The method of claim 9 wherein said RF pulse is a second order binomial RF pulse.

15. The method of claim 9 wherein said compound is $H_2O^{17}$.

16. A method of MR imaging of a patient, comprising:
    administering $H_2O$ containing $O^{17}$ to said patient; and
    applying an adiabatic RF pulse to said patient, wherein said RF pulse has a resonance frequency offset less than about 1000 Hz, and wherein said RF pulse creates substantial contrast between image signals from parts of said patient having different $O^{17}$ concentrations.

17. The method of claim 16 wherein said applying step comprises selecting an intensity, duration, and resonance frequency offset for said RF pulse such that said contrast results from different T2 relaxation times in said parts having different $O^{17}$ concentrations.

18. The method of claim 16 wherein said RF pulse creates an effective magnetic field of a tissue spin system in said patient, said effective magnetic field having two components, a first component along a static magnetic field in which said patient is placed and a second component orthogonal to said static magnetic field, a ratio of said second component to said first component being substantially less than one.

19. The method of claim 18 wherein said ratio is substantially near zero.

20. The method of claim 16 wherein said resonant frequency offset is less than about 700 Hz.

* * * * *